(12) United States Patent
Jeon

(10) Patent No.: US 7,530,820 B2
(45) Date of Patent: May 12, 2009

(54) TEMPERATURE-ACTIVATED SELF-EXTENDING SURFACE MOUNT ATTACHMENT STRUCTURES

(76) Inventor: Myoungsoo Jeon, 39422 Zacate Ave., Fremont, CA (US) 94539

( * ) Notice: Subject to any disclaimer, the term of this patent is extended or adjusted under 35 U.S.C. 154(b) by 170 days.

(21) Appl. No.: 11/807,776

(22) Filed: May 29, 2007

(65) Prior Publication Data
US 2008/0299801 A1 Dec. 4, 2008

(51) Int. Cl.
*H01R 12/00* (2006.01)
(52) U.S. Cl. .................. 439/83; 439/876; 29/832
(58) Field of Classification Search ............ 439/83, 439/876, 874; 29/832
See application file for complete search history.

(56) References Cited

U.S. PATENT DOCUMENTS

| | | | |
|---|---|---|---|
| 5,103,071 A * | 4/1992 | Henschen et al. ......... 219/85.22 |
| 5,735,696 A * | 4/1998 | Niitsu et al. .................. 439/65 |
| 6,155,886 A * | 12/2000 | Koseki et al. ............... 439/736 |
| 6,338,634 B1 * | 1/2002 | Yu .............................. 439/83 |
| 6,353,191 B1 * | 3/2002 | Harper, Jr. .................. 174/267 |
| 6,533,590 B1 | 3/2003 | Lee et al. ..................... 439/83 |
| 6,558,170 B1 | 5/2003 | Lemke ........................ 439/83 |
| 6,565,368 B1 | 5/2003 | Liao et al. .................... 439/83 |
| 6,641,410 B2 | 11/2003 | Marvin et al. ................ 439/83 |
| 6,644,985 B2 | 11/2003 | Wilson et al. ................ 439/83 |
| 6,679,709 B2 | 1/2004 | Takeuchi ..................... 439/83 |
| 6,692,265 B2 | 2/2004 | Kung et al. .................. 439/68 |
| 6,702,594 B2 | 3/2004 | Lee et al. ..................... 439/83 |
| 6,764,319 B1 * | 7/2004 | Korsunsky .................. 439/83 |
| 6,969,286 B1 | 11/2005 | Mongold et al. ............ 439/874 |
| 6,979,238 B1 | 12/2005 | Mongold et al. ............ 439/874 |
| 7,052,337 B2 | 5/2006 | Mongold et al. ............ 439/874 |
| 7,125,293 B2 | 10/2006 | Mongold et al. ............ 439/874 |

* cited by examiner

*Primary Examiner*—Gary F. Paumen
(74) *Attorney, Agent, or Firm*—Imperium Patent Works

(57) ABSTRACT

A surface mount component (for example, an electrical connector) includes a connector body portion and a plurality of temperature-activated self-extending surface mount attachment structures (TASESMAS). During a reflow solder process, amounts of solder within the connector melt. Surface and interfacial tensions of structures within the connector cause the TASESMAS structures to extend away from the connector body portion and toward an object (for example, a printed circuit board) to which the surface mount component is to be surface mount soldered. Each TASESMAS may self-extend a different amount to accommodate nonplanarities in the surface to which the component is to be surface mounted. When the component cools after reflow soldering, the amounts of solder solidify thereby fixing the TASESMAS structures in their extended positions.

21 Claims, 13 Drawing Sheets

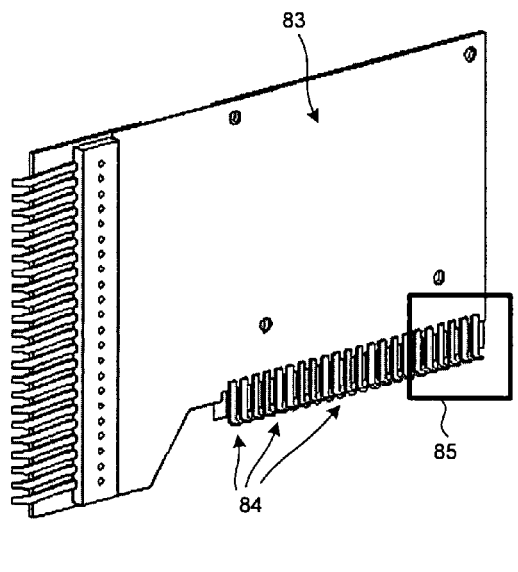
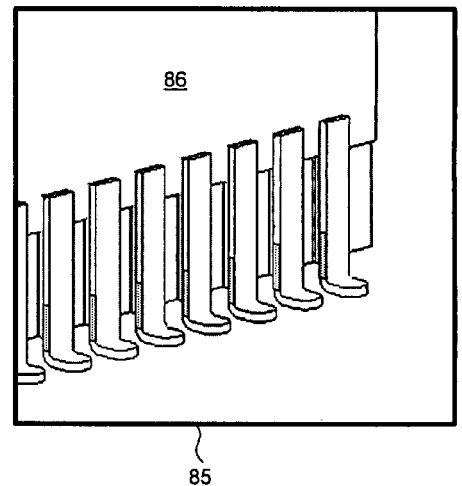
FIG. 17    FIG. 18
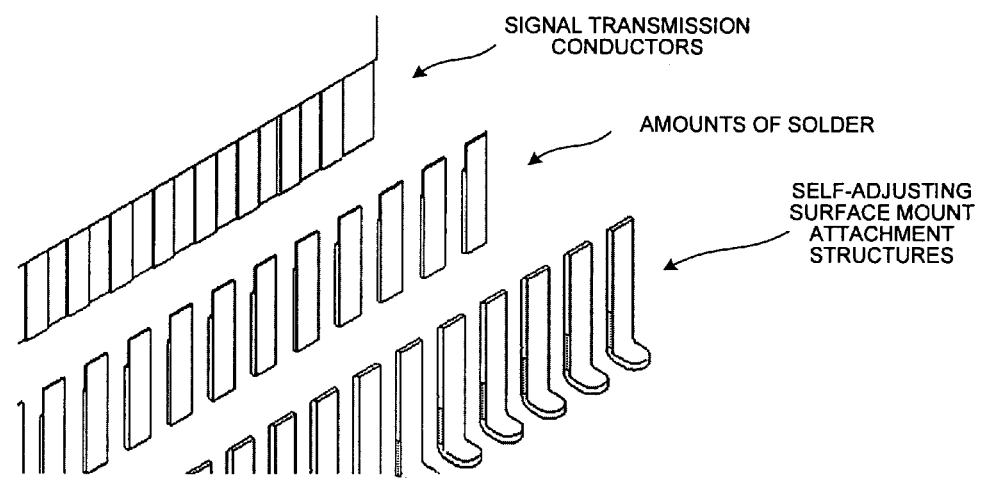
FIG. 19

INTERPOSER

TEMPERATURE-ACTIVATED SELF-EXTENDING SURFACE MOUNT ATTACHMENT STRUCTURES

BACKGROUND INFORMATION

FIG. 1 (Prior Art) is a cross-sectional diagram of a connector 1 that is to be surface mount soldered to a printed circuit board 2. The connector 1 includes a connector body portion 3 and a set of metal pins. The end of each metal pin is referred to as a "solder tail". Solder tail 4, for example, is the end of metal pin 5. In order to surface mount connector 1 to printed circuit board 2, solder-wettable contact pads or traces on the upper surface of printed circuit board 2 are covered with amounts of solder paste 6. The contact pads or traces are not illustrated in FIG. 1. The amounts of solder paste may, for example, be approximately 0.18 millimeters thick. Connector 1 is then placed down onto the printed circuit board 2 so that the solder tails of connector 1 are forced down into the solder paste.

FIG. 2 (Prior Art) is a cross-sectional diagram that shows connector 1 in place on the printed circuit board 2. An amount of solder paste is in contact with the bottom of each solder tail and the metal contact pad or metal trace below it. The structure of FIG. 2 is then heated in a reflow oven such that the solder in the solder paste melts and solders the solder tails to the underlying contacts pads or traces. The various parts such as the bottom of the connector and the upper surface of the printed circuit board are not, however, perfectly planar.

FIG. 3 (Prior Art) is a cross-sectional view of connector 1 being placed down onto a printed circuit board 7 that exhibits warpage. The upper surface of printed circuit board 7 is bowed. When connector 1 is placed down onto the printed circuit board prior to reflow soldering, the solder tails in the center of the connector make contact with the solder paste first. These solder tails are pushed down into the solder paste more than are the solder tails located toward the ends of the connector. The solder tails are therefore pressed down into the solder paste to different degrees. A solder tail may be pressed down into the solder paste so far that the solder paste under it is forced out from under the solder tail and to the sides of the solder tail to such a degree that the displaced solder paste bridges with the solder paste of a neighboring solder tail.

FIG. 4 (Prior Art) is an expanded view of a portion 8 of the structure of FIG. 3. Note that the amounts of solder paste under solder tails 9-12 have been forced together to form a single bridge 13 of solder paste. When the assembly of FIG. 3 is reflow soldered and is then cooled, the result can be bridges of solid solder that short adjacent pins together. This can occur even though areas of solder mask may separate adjacent contact pads under the adjacent solder tails. The solder may bridge over the solder mask.

FIG. 5 (Prior Art) is a cross-sectional diagram that illustrates connector 1 being placed down onto a printed circuit board 14 that is warped in a different way to have a concave upper surface. The solder tails in the center of the connector may be as much as 0.27 millimeters away from the upper surface of solder paste if the connector is two inches in length, if the solder tail coplanarity (alignment of the bottoms of the solder tails) is 0.2 millimeters over a distance of two inches, if the amounts of solder paste under the solder tails prior to reflow soldering is approximately 0.18 millimeters thick, and if warpage of the printed circuit board is approximately 0.250 millimeters over a distance of two inches. In this same situation, the solder tails at the ends of connector 1 are forced down into the solder paste more than the solder tails in the center portion of the connector. The same bridging problem explained above in connection with FIG. 3 may therefore occur in the structure of FIG. 5 between solder tails at the ends of the connector. A solution is desired.

SUMMARY

A surface mount component (for example, an electrical connector) includes a body portion and a plurality of temperature-activated self-extending surface mount attachment structures (TASESMAS). The body portion includes a plurality of signal transmission conductors. Each TASESMAS includes a self-adjusting surface mount attachment structure and an amount of a low melting-temperature metal (for example, solder). One end of the self-adjusting surface mount attachment structure is a solder tail (or other suitable end for making a surface mount solder connection) for surface attachment to another object (for example, a printed circuit board).

When the amount of the low melting-temperature metal of a TASESMAS melts (for example, during reflow soldering), the self-adjusting surface mount attachment structure is slidingly engageable with respect to a corresponding one of the signal transmission conductors. The melting of the amount of metal causes a force to be exerted on the self-adjusting surface mount attachment structure with respect to the body portion. This force tends to push the self-adjusting surface mount attachment structure so that it slides in a slide guide along its corresponding signal transmission conductor, thereby pushing its solder tail away from the body portion.

In one example, different parts of the sliding surface of the self-adjusting surface mount attachment structure and/or different parts of the sliding surface of the signal transmission conductor are plated with materials that have different affinities for molten solder. When the amount of solder of the TASESMAS melts during reflow soldering, surface and/or interfacial tensions of the solder pull on the self-adjusting surface mount attachment structure and the signal transmission conductor in such a way that the solder tail is pushed away from the body portion. The self-adjusting surface mount attachment structure moves the solder tail away from the body portion until the solder tail makes contact with an object (for example, an amount of solder on the upper surface of an underlying printed circuit board) that stops its movement. During the soldering process, the many TASESMAS structures of the surface mount component move independently of each other and can move out away from the body portion different amounts to accommodate nonplanarity in an upper surface of a printed circuit board to which the surface mount component is being surface mounted.

When the assembly cools after reflow soldering, the amount of solder of the TASESMAS solidifies such that the self-adjusting surface mount attachment structure remains in its extended position. The solder tail end of the self-adjusting surface mount attachment structure is left soldered to the surface of the object (for example, to the upper surface of a printed circuit board) by virtue of an amount of solder paste that was on the object prior to reflow soldering.

In one example, the conventional problem is avoided wherein solder tails are forced down into solder paste at component placement time and push the solder paste out from under the solder tails so that solder bridging between adjacent solder tails occurs. In the novel surface mount component that employs the novel TASESMAS structures, on the other hand, the self-adjusting surface mount attachment structures are in their retracted positions at component placement time prior to reflow soldering. The surface mount component can therefore be placed down onto the solder paste and the printed circuit board without the solder tails pushing down into the solder paste on the upper surface of the printed circuit board. The solder tails therefore do not unduly disturb and move the solder paste at component placement time prior to reflow soldering. By reducing the amount to which the solder paste is disturbed, the conventional solder bridging problem is reduced or avoided.

Other methods and structures are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 17 illustrates the novel TASESMAS in use in another type of connector.

FIG. 18 is an expanded view of a portion of the structure of FIG. 17.

FIG. 19 is an exploded view of the structures of a portion of FIG. 18.

DETAILED DESCRIPTION

Figure 1:
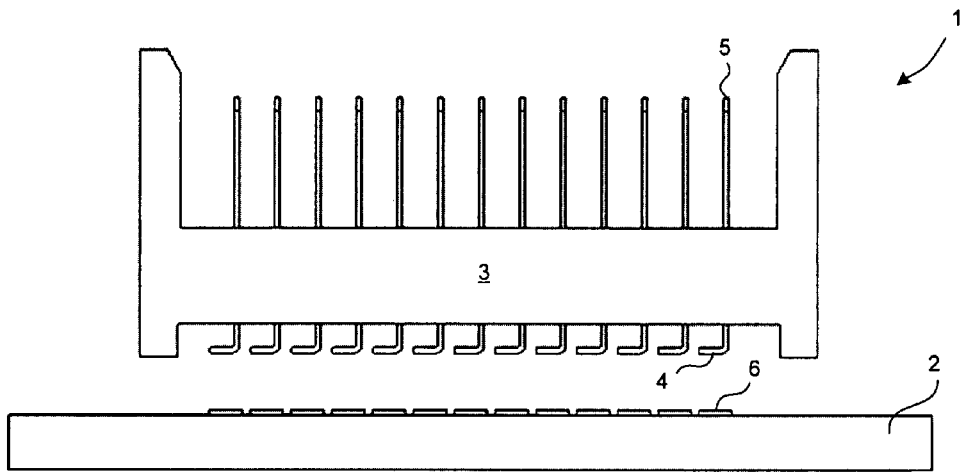
FIG. 1 (Prior Art) is a cross-sectional diagram of a connector 1 that is to be surface mount soldered to a printed circuit board 2.
Figure 2:
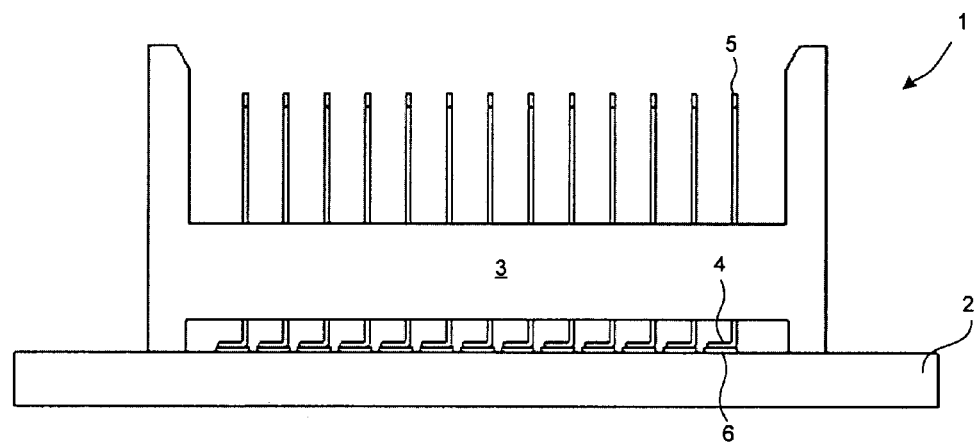
FIG. 2 (Prior Art) is a cross-sectional diagram that shows connector 1 in place on the printed circuit board 2.
Figure 3:
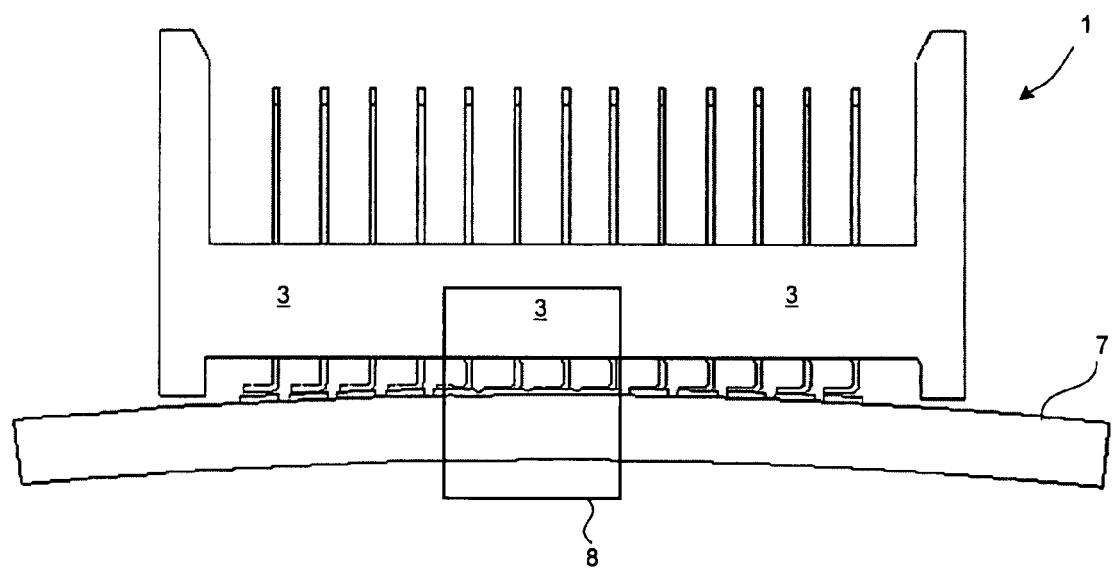
FIG. 3 (Prior Art) is a cross-sectional view of connector 1 being placed down onto a printed circuit board that exhibits warpage.
Figure 4:
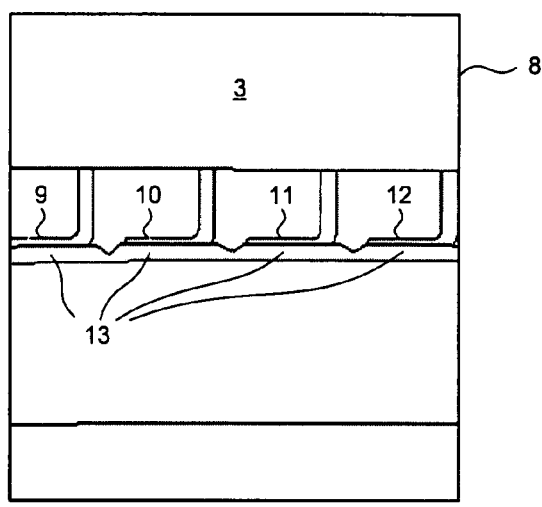
FIG. 4 (Prior Art) is an expanded view of a portion of the structure of FIG. 3.
Figure 5:
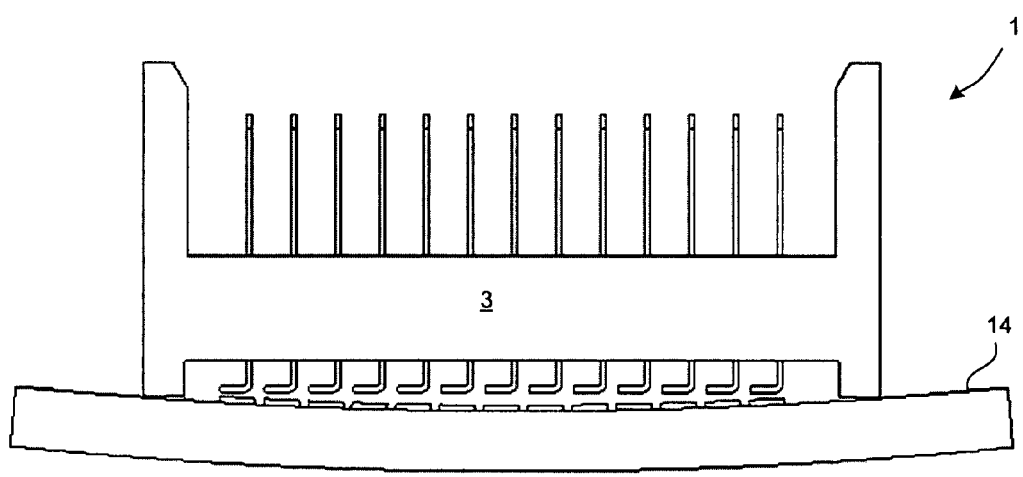
FIG. 5 (Prior Art) is a cross-sectional diagram that illustrates connector 1 being placed down onto a printed circuit board that is warped in a different way to have a concave upper surface.
Figure 6:
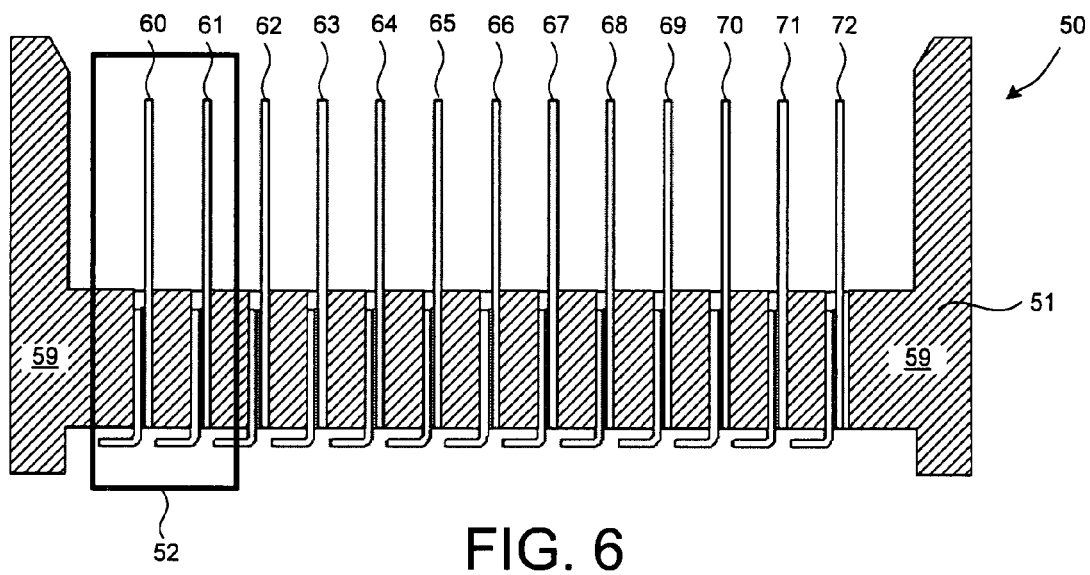
FIG. 6 is a cross-sectional diagram of an electrical connector in accordance with one novel aspect.

FIG. 6 is a cross-sectional diagram of an electrical connector 50 in accordance with one novel aspect. Connector 50 includes a connector body portion 51 and a plurality of temperature-activated self-extending surface mount attachment structures (TASESMAS). Each TASESMAS includes a self-adjusting surface mount attachment structure and an amount of a low melting-temperature metal. In the illustrated example, each self-adjusting surface mount attachment structure is an L-shaped strip of stamped metal. In the orientation of the illustration of FIG. 6, the bottom horizontally extending end portion of each strip is referred to as a "solder tail".

Figure 7:
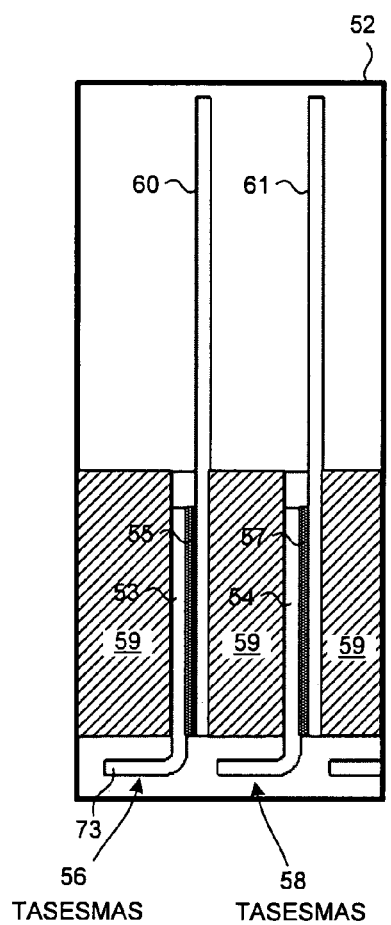
FIG. 7 is an expanded view of a portion of the structure of FIG. 6.

FIG. 7 is an expanded view of a portion 52 of the structure of FIG. 6. Portion 52 includes two L-shaped self-adjusting surface mount attachment structures 53 and 54. The darker layer 55 of material is the amount of low melting-temperature metal (for example, solder) that along with self-adjusting surface mount attachment structure 53 forms a first TASESMAS 56. The darker layer 57 of material is the amount of low melting-temperature metal (for example, solder) that along with self-adjusting surface mount attachment structure 54 forms a second TASESMAS 58. The cross-hatching in FIG. 7 represents an insulative housing 59 of connector body portion 51. This housing may, for example, be an injection molded article of plastic. In this example, connector body portion 51 includes the insulative housing 59 and a plurality of vertically oriented signal transmission conductors 60-72. If amount of solder 55 is molten, then self-adjusting surface mount attachment structure 53 can slidingly engage signal transmission conductor 60 and slide up and down in a slide guide. The slide guide ensures that the self-adjusting surface mount attachment structure 53 can only move up and/or down along a single line. The slide guide is a channel formed by insulative housing 59 on three sides and by signal transmission conductor 60 on a fourth side. When the self-adjusting surface mount attachment structure 53 slides, the molten solder 55 makes contact and wets portions of both the self-adjusting surface mount attachment structure 53 and the signal transmission conductor 60. In the orientation of the illustration of FIG. 6, the solder tail 73 at the end of self-adjusting surface mount attachment structure 53 can be made to move up and down with respect to the remainder of connector 50. The other solder tails of the other self-adjusting surface mount attachment structures can also be made to move up and down in similar fashions. The self-adjusting surface mount attachment structures are independently movable with respect to each other.

Figures 8, 9, 10:
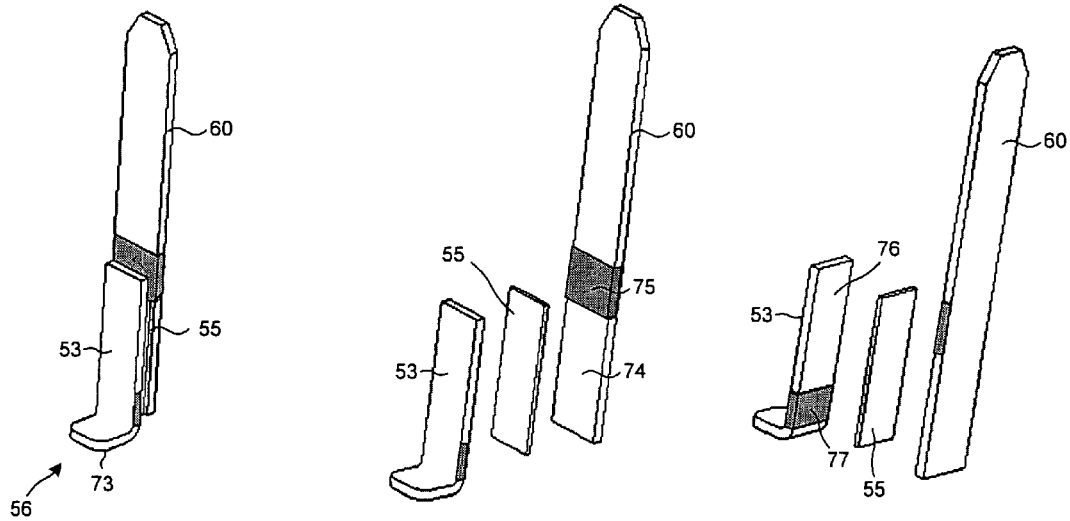
FIG. 8 is a perspective view of a self-adjusting surface mount attachment structure, a signal transmission conductor, and amount of solder between the two.
FIG. 9 is an exploded view of the structure of FIG. 8.
FIG. 10 is an exploded view of the structure of FIG. 8 from another vantage point.

FIG. 8 is a perspective view of self-adjusting surface mount attachment structure 53, signal transmission conductor 60, and the amount of solder 55 between the two. Signal transmission conductor 60 has a planar sliding surface that faces the self-adjusting surface mount attachment structure 53. A first area 74 of this sliding surface is made of a material that has a higher affinity for liquid solder than a second area 75 that has a lower affinity for liquid solder. Affinity for liquid solder is sometimes referred to as "wettability" or "solderability". The contact angle between liquid solder and a material can be used as an indicator of the wettability of the material.

FIG. 9 is an exploded view of the structure of FIG. 8. The first area 74 and the second area 75 of the sliding surface of signal transmission conductor 60 are illustrated.

Self-adjusting surface mount attachment structure 53 also has a planar sliding surface. This sliding surface faces the sliding surface of the signal transmission conductor 60. A first area 76 of this sliding surface is made of a material that has a higher affinity for liquid solder than a second area 77 that has a lower affinity for liquid solder.

FIG. 10 is an exploded view of the structure of FIG. 8 from another vantage point. The first area 76 and the second area 77 of the sliding surface of self-adjusting surface mount attachment structure 53 are illustrated. The first and second areas of the self-adjusting surface mount attachment structure 53 and the signal transmission conductor 60 may, for example, be selectively plated with different materials.

In one example, the first areas are plated with thin layers of gold, whereas the second areas are plated with layers of chromium. Other materials that have a relatively high affinity for solder include tin, cadmium, silver, palladium, and rhodium, copper, bronze, brass, lead, nickel-silver, and beryllium-copper. Other materials that have a relatively low affinity for solder include titanium, tantalum, magnesium, stainless steel, high-alloy steel, aluminum, and aluminum-bronze.

Figures 11, 12:
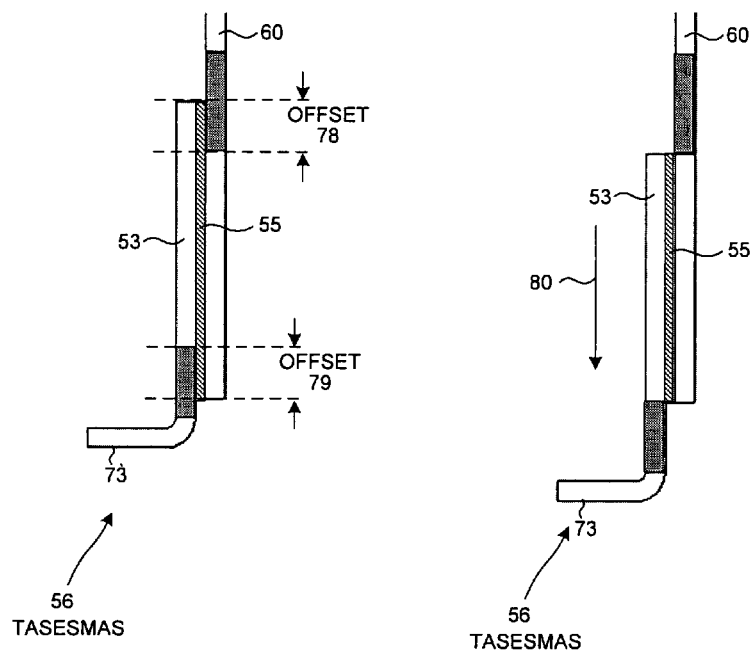
FIG. 11 is a side view of the structure of FIG. 8.
FIG. 12 illustrates a movement during reflow soldering.

FIG. 11 is a side view of the structure of FIG. 8. Prior to reflow soldering when the connector 50 is placed down onto a printed circuit board, the solder 55 holds the self-adjusting surface mount attachment structure 53 and the signal transmission conductor 60 in face-to-face relation in the orientation illustrated in FIG. 11 such that the two relatively solder-wettable areas 74 and 76 are offset from one another. The areas of offset are identified by reference numerals 78 and 79.

During reflow soldering, the structure is heated and the temperature of the amount of solder 55 increases to the point that solder 55 melts. When the amount of solder 55 melts, the self-adjusting surface mount attachment structure 53 becomes slidingly engageable with respect to and signal transmission conductor 60. The offsets 78 and 79 and the differential solder-wettability of the areas 74-77 and the surface/interfacial tension of the solder cause a force to be exerted on TASESMAS 56 with respect to the connector body portion 51 that tends to push solder tail 73 away from connector body portion 51. In the orientation of the illustration of FIG. 11, self-adjusting surface mount attachment structure 53 and its solder tail 73 are forced downward. If the path of self-adjusting surface mount attachment structure 53 is not obstructed (for example, due to solder tail 73 contacting solder on the upper surface of a printed circuit board), then self-adjusting surface mount attachment structure 53 moves during reflow soldering due to the force. The self-adjusting surface mount attachment structure 53 slides in its slide guide such that solder tail 73 moves away from the connector body portion 51.

FIG. 12 illustrates this movement in direction 80. The movement reduces the areas of offsets 78 and 79.

Figure 13:
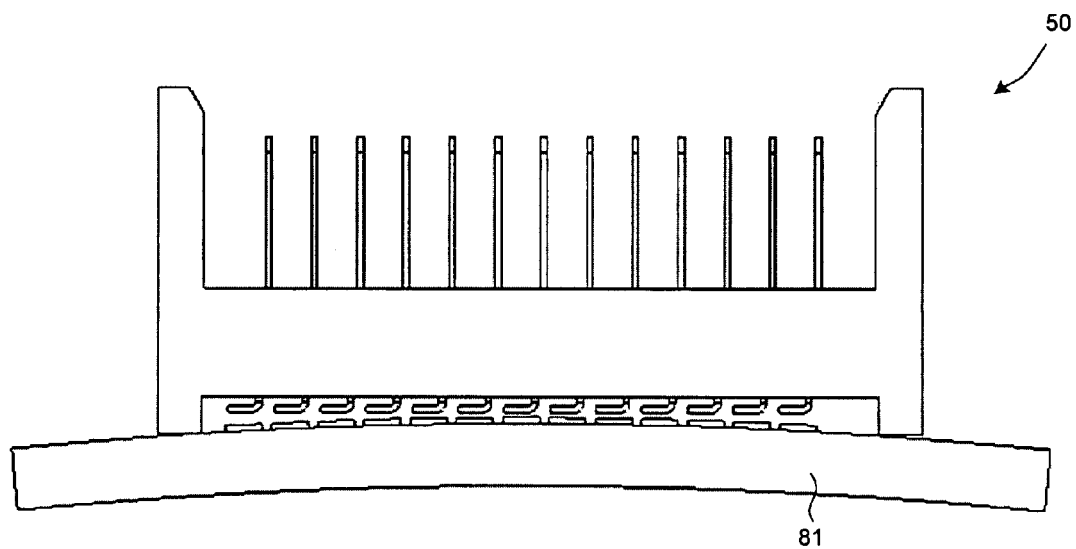
FIG. 13 is a diagram of connector 50 prior to reflow soldering.

FIG. 13 is a diagram of connector 50 prior to reflow soldering and temperature activation of the temperature-activated self-adjusting surface mount attachment structures. Connector 50 is in place on a printed circuit board 81 that exhibits an exaggerated amount of warpage. The temperature-activated self-extending surface mount attachment structures are in their pre-activation retracted positions. The orientation of the temperature-activated self-extending surface mount attachment structures is as illustrated in FIG. 11. An amount of solder paste is disposed under each solder tail. The amounts of solder paste cover solder-wettable contact pads or traces on the upper surface of printed circuit board 81. The contact pads or traces are not illustrated in FIG. 13. After component placement and prior to reflow soldering, many or all of the solder tails do not contact solder paste on the underlying printed circuit board.

After being placed on the printed circuit board 81 as illustrated in FIG. 13, the assemblage of FIG. 13 is heated in a reflow soldering process to surface mount connector 50 to printed circuit board 81. In each TASESMAS, the temperature of the amount of solder increases to the point that the solder melts and the solder tail moves downward until its downward movement is resisted enough by the underlying object (the solder and printed circuit board) that the downward movement of the solder tail stops.

Figure 14:
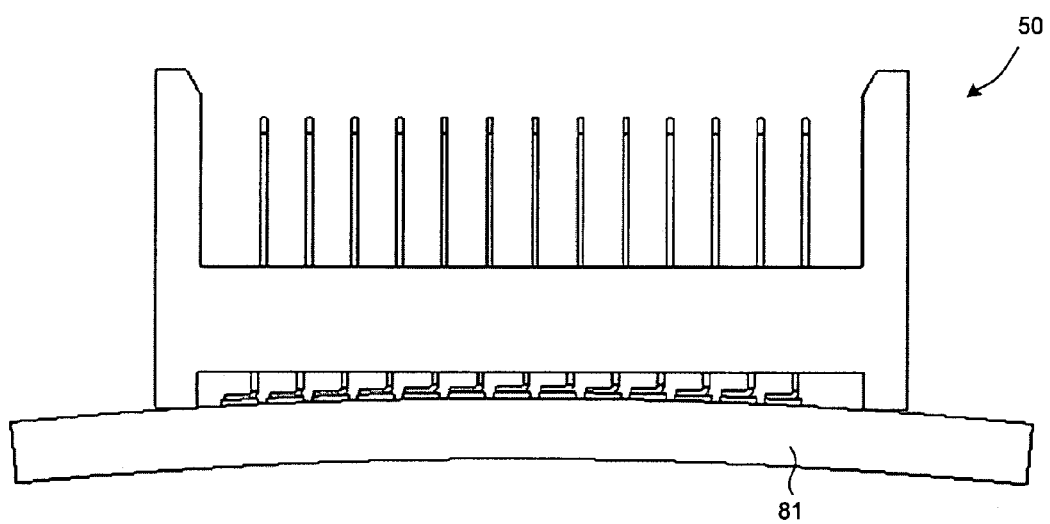
FIG. 14 shows the resulting connector 50 after reflow soldering.

FIG. 14 shows the resulting assembly after reflow soldering. The blocks that denote solder paste in FIG. 13 denote solidified solder in FIG. 14. Each self-adjusting surface mount attachment structure of each TASESMAS has moved downward the amount needed to in order for its solder tail to make contact with the underlying solder and printed circuit board 81. In one example, the connector 50 is more than one inch in length and has a row of at least one hundred TASESMAS structures.

Figure 15:
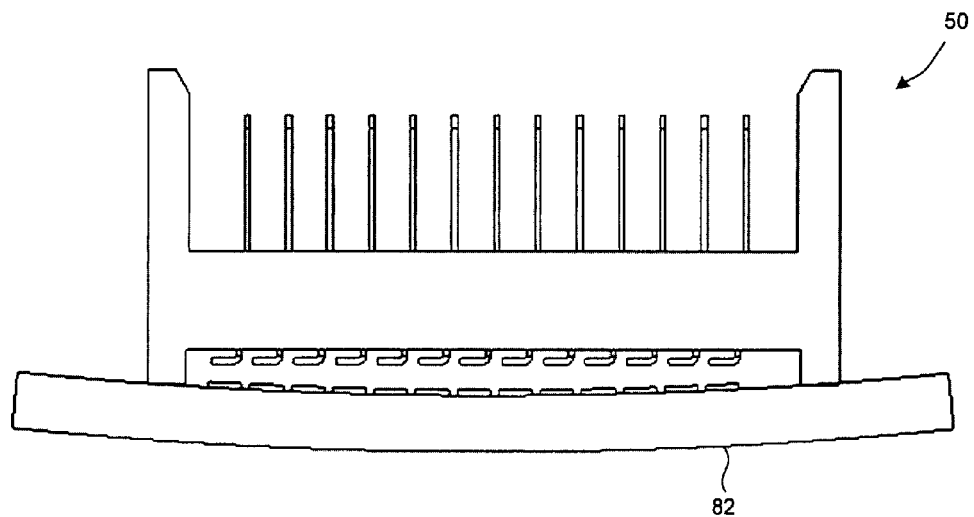
FIG. 15 is a cross-sectional diagram of connector 50 prior to reflow soldering where the upper surface of printed circuit board 82 has a different type of non-planarity.

FIG. 15 is a cross-sectional diagram of connector 50 prior to reflow soldering where the upper surface of printed circuit board 82 has a different type of non-planarity.

Figure 16:
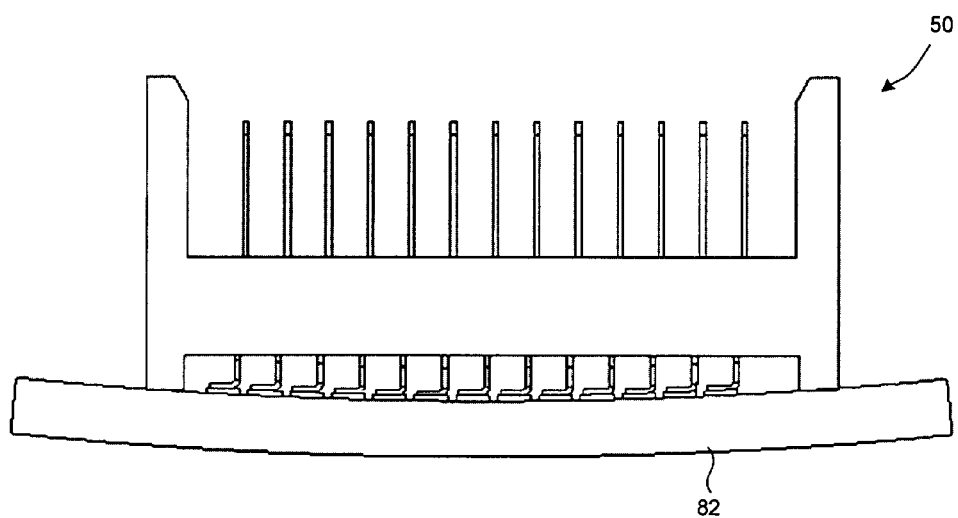
FIG. 16 is a cross-sectional diagram of connector 50 after reflow soldering.

FIG. 16 is a cross-sectional diagram of connector 50 after reflow soldering. The various temperature-activated self-extending surface mount attachment structures have extended to different degrees so that all the solder tails have made appropriate contact with the non-planar printed circuit board and solder below. In one embodiment, the amount of pressure exerted by each solder tail is not so much as to cause solder bridging due to forcing too much molten solder out from underneath solder tails. To prevent the connector from being lifted up off the surface of the printed circuit board when the TASESMAS structures extend, the connector body portion can be mechanically fixed to the printed circuit board. In one example, the connector body portion includes pegs that are press fit into accommodating holes in the printed circuit board, and the press fit prevents the connector from being lifted during the reflow process.

The connector structure of FIGS. 6-16 is but one of many different surface mount component structures that can employ the novel temperature-activated self-extending surface mount attachment structures (TASESMAS). FIG. 17 illustrates the novel TASESMAS in use in another type of connector. The connector of FIG. 17 is of a structure set forth in U.S. Pat. No. 7,121,889 entitled "High Speed Connector Assembly With Laterally Displaceable Head Portion". The connector includes a set of flexible printed circuit (FPC) portions. FIG. 17 illustrates one such FPC portion 83. FPC portion 83 includes a row 84 of TASESMAS structures.

FIG. 18 is an expanded view of a portion 85 of the structure of FIG. 17. Each TASESMAS is of the structure of FIG. 8, except that the signal transmission conductor in the example of FIG. 17 is a part of FPC 83. Rather than the signal transmission conductor being selectively plated with areas having different affinities for solder, a layer of solder mask 86 is provided on FPC 83 as the non-wettable area. The self-adjusting surface mount attachment structures are forced downward when the solder of the TASESMAS melts so that opposing areas of solder-wettable material on the self-adjusting surface mount attachment structure and the associated signal transmission conductor can be closer together with less of an offset.

Figure 20:
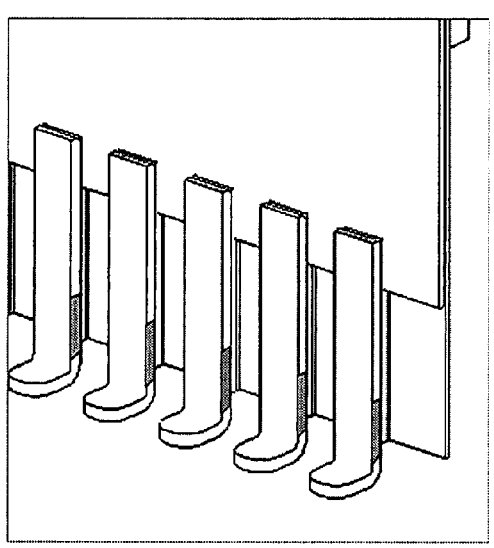
FIG. 20 illustrates the structure before temperature-activation when the TASESMAS structures are in their retracted positions.
Figure 21:
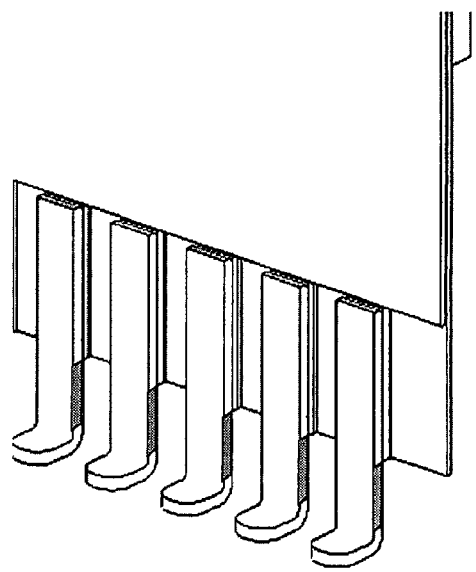
FIG. 21 illustrates the structure after temperature-activation when the TASESMAS structures are in their fully extended positions.

FIG. 19 is an exploded view of the structures of portion 85 of FIG. 18. FIG. 20 illustrates the structure before temperature-activation when the TASESMAS structures are in their retracted positions. FIG. 21 illustrates the structure after temperature-activation when the TASESMAS structures are in their fully extended positions.

Figure 22:
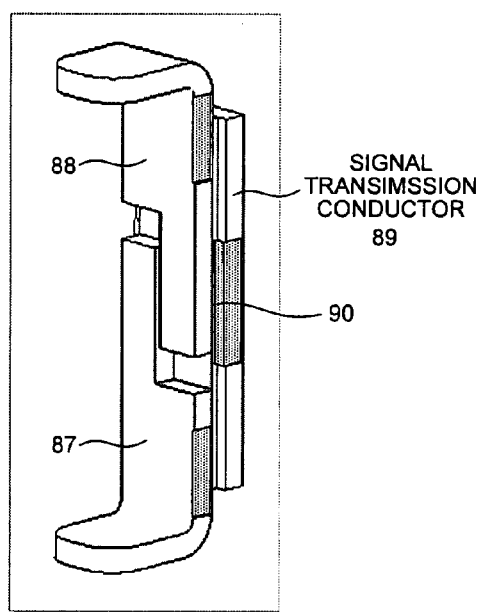
FIG. 22 is a perspective view of another version of a TASESMAS.

FIG. 22 is a perspective view of another version of a TASESMAS. In the example of FIG. 22, there are actually two interdigitated self-adjusting surface mount attachment structures 87 and 88. Upon temperature activation, structure 87 is forced in a first direction (for example, downward as illustrated) and structure 88 forced in an opposing direction (for example, upward as illustrated). Both self-adjusting surface mount attachment structures 87 and 88 slide with respect to signal transmission conductor 89.

Figure 23:
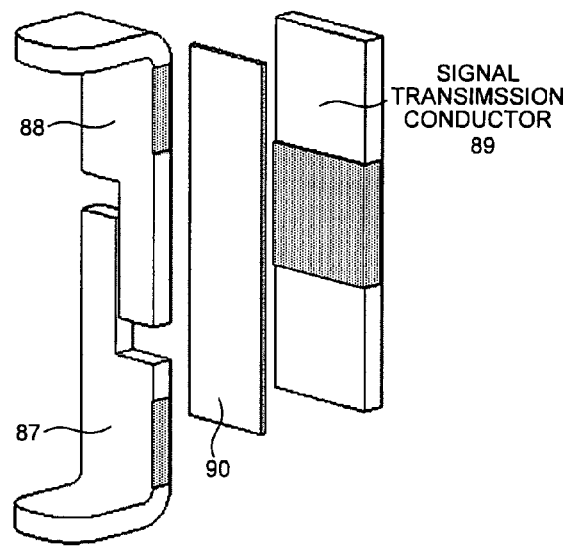
FIG. 23 is an exploded view of the structure of FIG. 22.

FIG. 23 is an exploded view of the structure of FIG. 22. Signal transmission conductor 89 is wider than the widths of the self-adjusting surface mount attachment structures 87 and 88 so that the side edges of the signal transmission conductor 89 can be press fit into a connector body portion to hold the signal transmission conductor in place without binding the side edges of the self-adjusting surface mount attachment structures 87 and 88. The areas of dark shading in FIGS. 22 and 23 denote areas of material that has a relatively low affinity for solder, whereas the lighter shading of the other areas of the sliding surfaces denote areas of material that has a relatively high affinity for solder. The amount of solder is identified with reference numeral 90.

Figure 24:
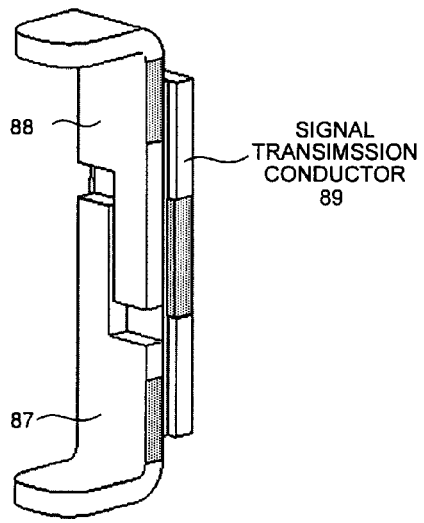
FIG. 24 illustrates the structure of FIG. 22 prior to temperature activation.

FIG. 24 illustrates the structure of FIG. 22 prior to temperature activation. The self-adjusting surface mount attachment structures 87 and 88 are in their pre-activation retracted positions.

Figure 25:
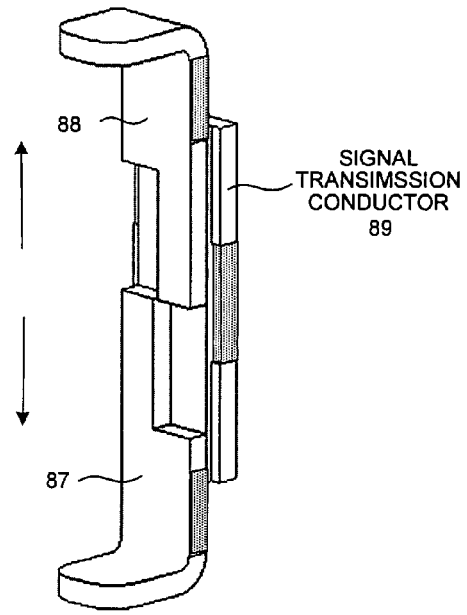
FIG. 25 illustrates the structure of FIG. 22 after temperature activation.

FIG. 25 illustrates the structure of FIG. 22 after temperature activation. The self-adjusting surface mount attachment structures 87 and 88 are in their fully extended positions.

Figure 26:
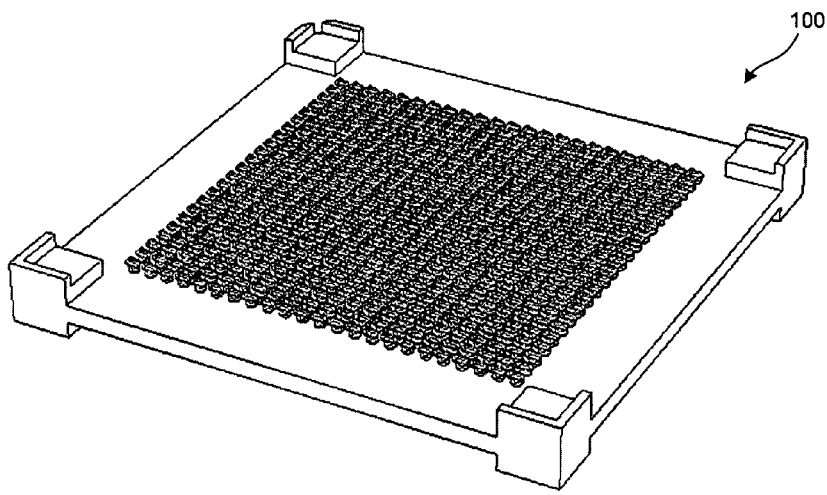
FIG. 26 illustrates a Land Grid Array (LGA) surface mount interposer 100 that includes a two-dimensional array of TASESMAS.

The novel TASESMAS sees use in applications other than connectors. FIG. 26, for example, illustrates a Land Grid Array (LGA) surface mount interposer 100 that includes a two-dimensional array of TASESMAS. In one application, interposer 100 is sandwiched between a Ball Grid Array (BGA) integrated circuit package and a printed circuit board or other object to which the integrated circuit package is to be coupled.

Figure 27:
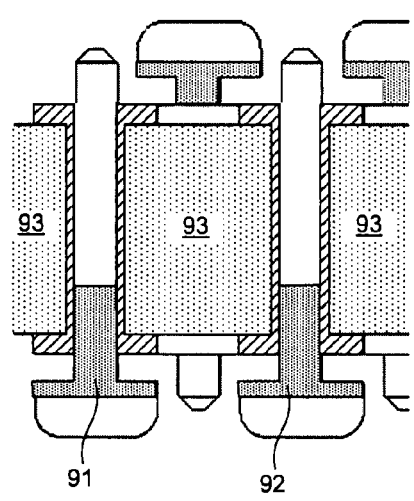
FIG. 27 is a cross-sectional diagram of two TASESMAS structures of the structure of FIG. 26.

FIG. 27 is a cross-sectional diagram of two TASESMAS structures of the structure of FIG. 26. The self-adjusting surface mount attachment structures 91 and 92 in this case are pins of stamped metal. Each pin is disposed in a corresponding plated through hole in a body portion 93. Body portion 93 may, for example, be a printed circuit board substrate of the interposer 100. The dark shading of the shaft of the pins of FIG. 27 denote surfaces of a material that has a relatively low affinity for solder, whereas the lighter shading of the remainder of the shaft of the pins denote surfaces of a material that has a relatively high affinity for solder. The plated through holes are plated with low melting-temperature metal (for example, solder). Prior to temperature activation, the structure appears as illustrated in FIG. 27. The low melting-temperature metal holds the pins in place.

Figure 28:
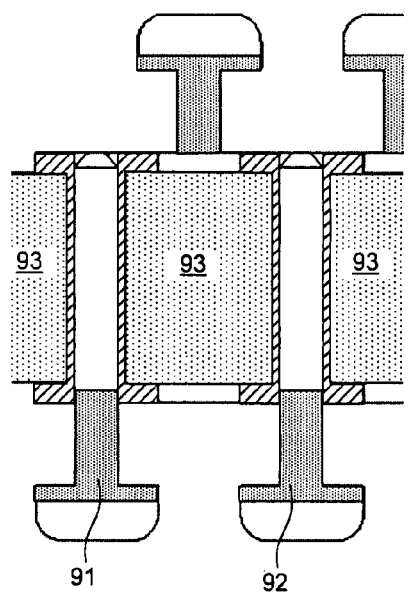
FIG. 28 is a cross-sectional diagram of the two TASESMAS structures of FIG. 27 after temperature activation.

FIG. 28 is a cross-sectional diagram of the two TASESMAS structures of FIG. 27 after temperature activation. When the low melting-temperature metal of the plated through holes is heated and becomes molten, the surface/interfacial tension of the molten metal and its differential affinity for the different parts of pins 91 and 92 exerts forces on pins 91 and 92 that force the pins out from the body portion 93. If the path of a pin is unobstructed, then the pin moves until the force is countered (for example, due to the pin contacting an object). As illustrated, interposer 100 includes TASESMAS pins that can extend from one major surface of the body portion 93 and also includes other TASESMAS pins that can extend from the opposite major surface of the body portion 93.

Figure 29:
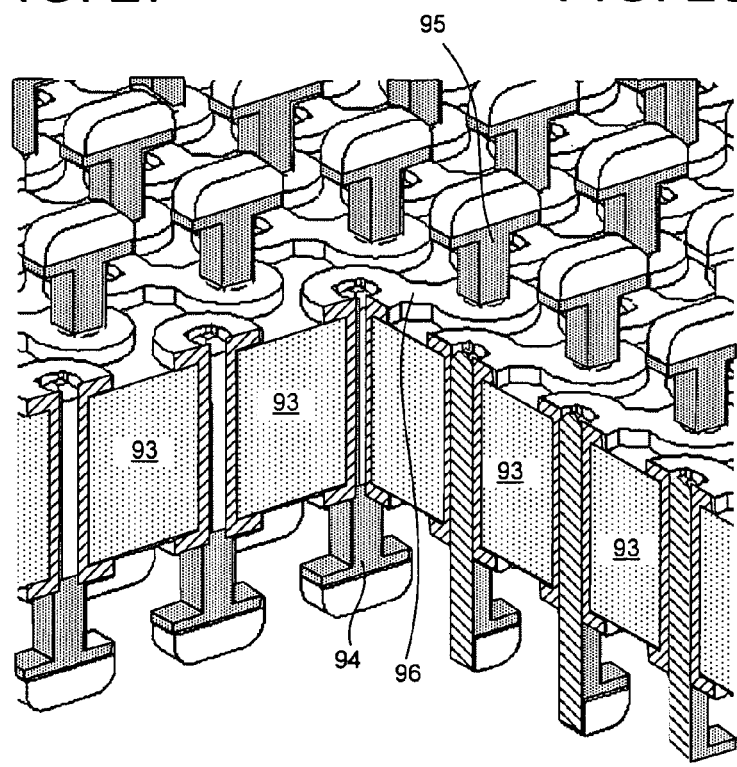
FIG. 29 is a cross-sectional perspective view of a part of the interposer 100 of FIG. 26.

FIG. 29 is a cross-sectional perspective view of a part of the interposer 100 of FIG. 26. The TASESMAS pins are electrically coupled together in pairs so that an electrical signal can be communicated from one side of the interposer, through one of the TASESMAS pins, through another of the TASESMAS pins, and to the other side of the interposer. In the illustration, TASESMAS pin 94 is coupled to TASESMAS pin 95 by a conductive trace 96.

Figure 30:
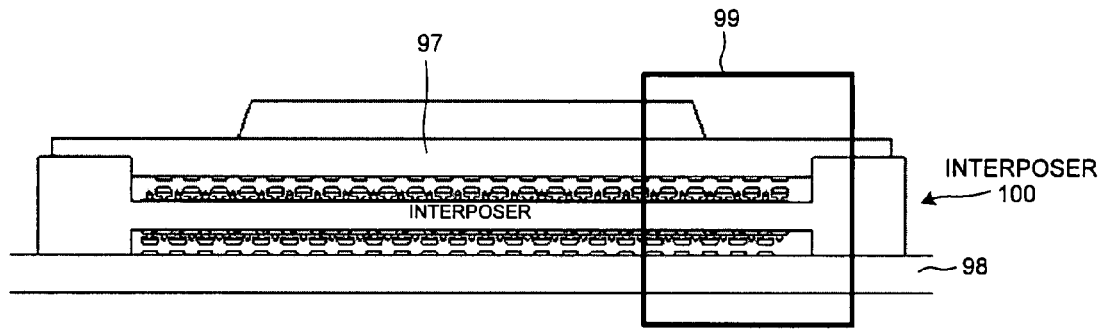
FIG. 30 is a side view of interposer 100 of FIG. 26.

FIG. 30 is a side view of interposer 100 of FIG. 26. Interposer 100 is disposed between a BGA integrated circuit package 97 and an array of lands on an underlying printed circuit board 98. In this specific example, the solder balls on the bottom of BGA package 97 are not actually formed into spheres but rather have disc shapes as illustrated in FIG. 30. FIG. 30 shows the assemblage prior to temperature activation of the interposer. The self-adjusting surface mount attachment structures of the interposer are in their retracted positions.

Figure 31:
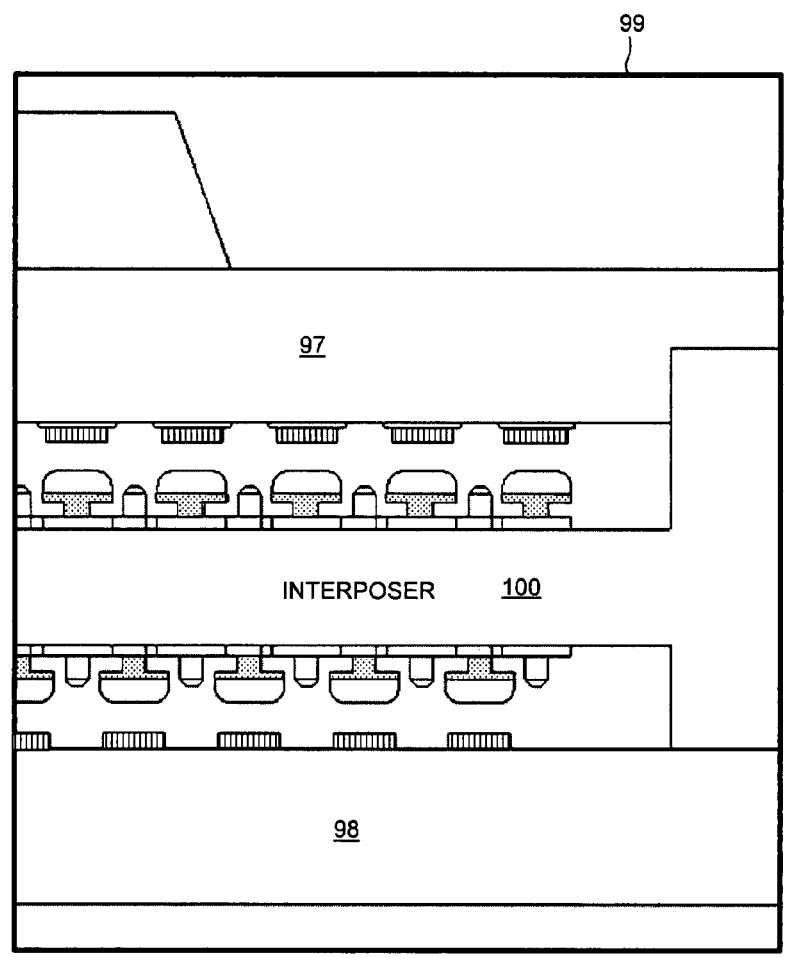
FIG. 31 is an expanded view of a portion of FIG. 30.

FIG. 31 is an expanded view of portion 99 of FIG. 30.

Figure 32:
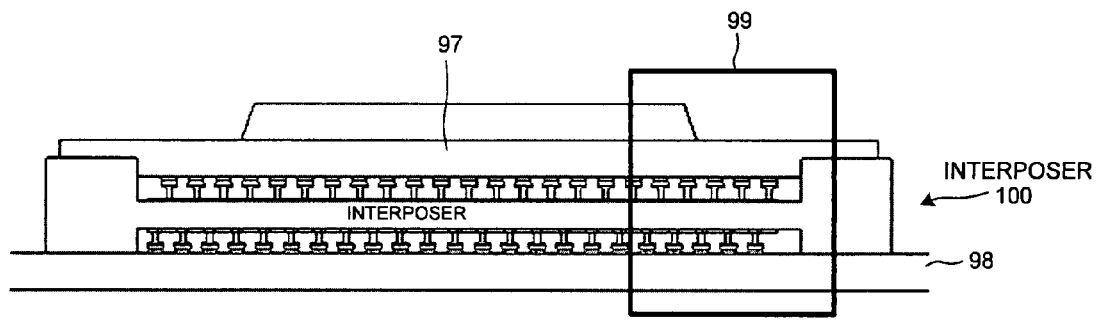
FIG. 32 is a side view of the assemblage of FIG. 30 after reflow soldering.

FIG. 32 is a side view of the assemblage of FIG. 30 after reflow soldering. The solder tails of some of the self-adjusting surface mount attachment structures have been forced away from the interposer and downward so that the solder tails make contact with solder on printed circuit board 98. The solder tails of others of the self-adjusting surface mount attachment structures have been forced away from the interposer and upward so that the solder tails make contact with corresponding ones of the solder balls (solder discs) of the bottom of BGA integrated circuit package 97.

Figure 33:
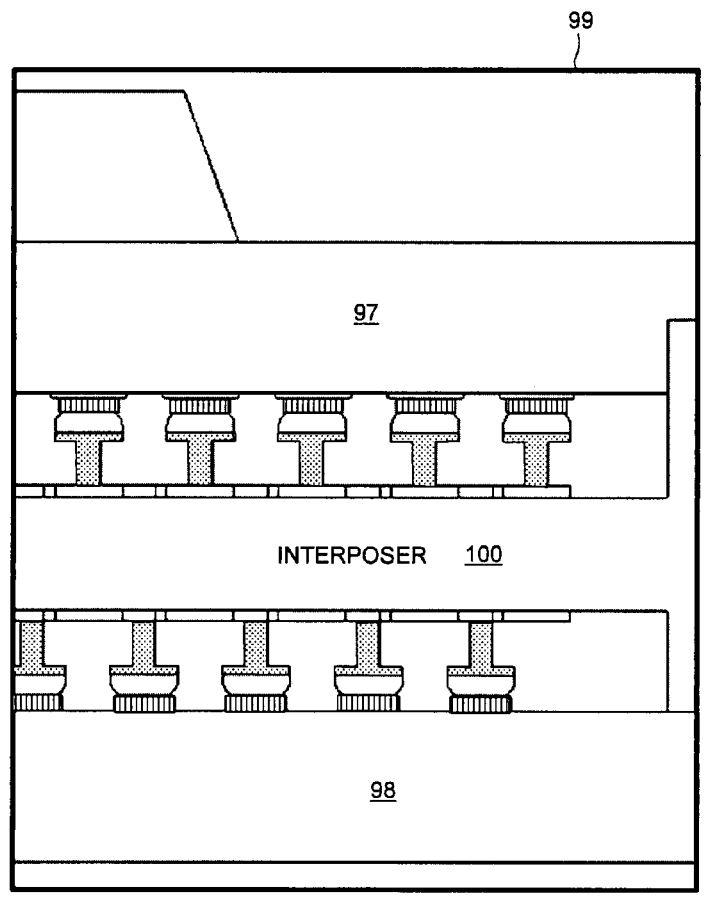
FIG. 33 is an expanded view of a portion of the assemblage of FIG. 32 after temperature activation.

FIG. 33 is an expanded view of portion 99 of the assemblage of FIG. 32 after temperature activation. The self-adjusting surface mount attachment pins are in extended positions. Each solder ball (solder disc) of the BGA integrated circuit package 97 is electrically coupled through a pair of self-adjusting surface mount attachment pins to a corresponding solder pad or trace or land on underlying printed circuit board 98. Although the self-adjusting surface mount attachment pins are illustrated in FIGS. 32 and 33 to have extended out from the body of the interposer by equal amounts, the various self-adjusting surface mount attachment pins can extend out different amounts to accommodate nonplanarity of an object to which the interposer is to be attached.

Although the present invention has been described in connection with certain specific embodiments for instructional purposes, the present invention is not limited thereto.

Although solder is described as the material that melts and causes the force to be exerted on the self-adjusting surface mount attachment structures, another suitable material can be employed. The force can be due to or partially due to a mechanical means whose force is released by the melting of the low melting-temperature metal. The TASESMAS structures need not be propelled by forces due to surface tensions and/or interfacial tensions, but rather can be propelled by other forces. Accordingly, various modifications, adaptations, and combinations of various features of the described embodiments can be practiced without departing from the scope of the invention as set forth in the claims.

What is claimed is:

1. An electrical connector comprising:
 a connector body portion including a plurality of signal transmission conductors; and
 a plurality of temperature-activated self-extending surface mount attachment structures (TASESMAS), wherein each TASESMAS includes an amount of a low melting-temperature metal and a solder tail, wherein each TASESMAS is slidingly engageable with respect to a corresponding one of the signal transmission conductors if the amount of metal of said each TASESMAS is molten, and wherein a melting of the amount of metal causes a force to be exerted on the TASESMAS with respect to the connector that tends to push the solder tail away from the connector body portion.

2. The electrical connector of claim 1, wherein said force may not cause the TASESMAS to move with respect to the connector body portion if a path of the TASESMAS is obstructed by an object outside the electrical connector, but wherein said force does cause the TASESMAS to move with respect to the connector body portion if the path is unobstructed.

3. The electrical connector of claim 1, wherein each TASESMAS has a first area of a sliding surface that is of a material that has a higher affinity for solder than a second area of the sliding surface that is of a material that has a lower affinity for solder, wherein the signal transmission conductor with which the TASESMAS is slidingly engageable has a first area of a sliding surface that is of a material that has a higher affinity for solder than the material of the lower affinity, wherein the amount of metal is solder that is disposed between the TASESMAS and the signal transmission conductor, and wherein the first area of the TASESMAS and the first area of the signal transmission conductor are offset with respect to one another such that if the amount of metal is melted then surface and interfacial tensions of the molten metal exert the force so as to minimize the offset if the TASESMAS is free to move with respect to the signal transmission conductor.

4. The electrical connector of claim 1, wherein the connector body portion is a flexible printed circuit (FPC), and wherein the signal transmission conductors are conductors that are part of the FPC.

5. The electrical connector of claim 1, wherein the connector body portion includes an insulative housing and the plurality of signal transmission conductors.

6. The electrical connector of claim 1, wherein each TASESMAS is independently movable with respect to each other TASESMAS.

7. The electrical connector of claim 1, wherein said force is due at least in part to a surface tension of the amount of metal when the amount of metal is molten.

8. The electrical connector of claim 1, wherein the electrical connector is an interposer.

9. The electrical connector of claim 1, wherein the solder tails of a first set of the temperature-activated self-extending surface mount attachment structures (TASESMAS) are pushed away from the connector body portion in a first direction if the amounts of low melting-temperature metal of the first set are molten, and wherein the solder tails of a second set of the TASESMAS are pushed away from the connector body portion in a second direction if the amounts of low melting-temperature metal of the second set are molten, wherein the second direction is substantially opposite to the first direction.

10. The electrical connector of claim 1, wherein the connector body portion includes an insulative housing and the plurality of signal transmission conductors, and wherein the plurality of solder tails of the TASESMAS forms a two-dimensional array of solder tails.

11. The electrical connector of claim 1, wherein the plurality of TASESMAS are disposed in a row, and wherein the row is more than one inch in length.

12. A method comprising:
 using surface and interfacial tensions of a molten metal to force a solder tail away from a connector body portion of a surface mount connector during a solder reflow operation, wherein the molten metal and the solder tail are parts of the surface mount connector.

13. The method of claim 12, wherein the solder reflow operation results in the surface mount connector being surface mount soldered to an object, and wherein the solder tail moves during the reflow operation away from the connector body portion and toward the object.

14. The method of claim 12, wherein the molten metal is an amount of solder, wherein a signal transmission conductor is part of the connector body portion, wherein the solder tail is a part of a self-adjusting surface mount attachment structure, and wherein the molten metal wets both a portion of the signal transmission conductor as well as a portion of the self-adjusting surface mount attachment structure.

15. The method of claim 12, wherein the surface mount connector includes at least one hundred substantially identical solder tails.

16. A method comprising:
 (a) placing a surface mount connector on an object to which the surface mount connector is to be soldered, wherein the surface mount connector includes a connector body portion, an amount of low melting-temperature material, and a self-adjusting surface mount attachment structure;
 (b) melting the amount of material in a reflow soldering process, wherein the melting causes a surface/interfacial tension force to develop in the connector that moves a portion of the self-adjusting surface mount attachment structure away from a connector body portion and toward the object; and
 (c) cooling the surface mount connector such that the amount of material in the surface mount connector solidifies thereby fixing the self-adjusting surface mount attachment structure with respect to the connector body portion.

17. The method of claim 16, wherein the self-adjusting surface mount attachment structure includes a sliding surface, wherein a first portion of the sliding surface is of a material that has a relatively high affinity for solder, wherein a second portion of the sliding surface is a material that has a relatively low affinity for solder.

18. The method of claim 16, wherein the self-adjusting surface mount attachment structure moves by sliding with respect to a sliding surface of the connector body portion, wherein a first portion of the sliding surface is of a material that has a relatively high affinity for solder, wherein a second portion of the sliding surface is a material that has a relatively low affinity for solder.

19. The method of claim 16, wherein steps (a), (b) and (c) result in the surface mount connector being surface mount soldered to the object, and wherein the surface mount connector includes at least one hundred substantially identical self-adjusting surface mount attachment structures.

20. An electrical connector comprising:
a connector body portion;
a solder tail; and
means for using a surface tension and an interfacial tension within the electrical connector to move the solder tail away from the connector body portion, wherein the connector body portion and the solder tail are parts of the electrical connector.

21. The electrical connector of claim 20, wherein the surface tension and the interfacial tension are tensions involving molten solder, wherein the molten solder is part of the electrical connector.

* * * * *